US007461718B2

(12) United States Patent
Dedieu et al.

(10) Patent No.: US 7,461,718 B2
(45) Date of Patent: Dec. 9, 2008

(54) LOUDSPEAKER ENCLOSURE INCORPORATING A LEAK TO COMPENSATE FOR THE EFFECT OF ACOUSTIC MODES ON LOUDSPEAKER FREQUENCY RESPONSE

(75) Inventors: Stephane Dedieu, Ottawa (CA); Philippe Moquin, Ottawa (CA)

(73) Assignee: Mitel Networks Corporation, Ottawa, Ontario (CA)

( * ) Notice: Subject to any disclaimer, the term of this patent is extended or adjusted under 35 U.S.C. 154(b) by 118 days.

(21) Appl. No.: 11/008,510

(22) Filed: Dec. 10, 2004

(65) Prior Publication Data

US 2005/0126846 A1 Jun. 16, 2005

(30) Foreign Application Priority Data

Dec. 10, 2003 (GB) ................................ 0328639.0

(51) Int. Cl.
*H05K 5/00* (2006.01)

(52) U.S. Cl. ....................... 181/148; 181/199; 381/345; 381/349

(58) Field of Classification Search ................. 181/148, 181/199; 381/345, 349
See application file for complete search history.

(56) References Cited

U.S. PATENT DOCUMENTS

| | | | | |
|---|---|---|---|---|
| 1,869,178 | A | 7/1932 | Thuras | |
| 2,031,500 | A | 2/1936 | Olney | |
| 4,549,631 | A | 10/1985 | Bose | |
| 4,593,784 | A * | 6/1986 | Flanders | 181/144 |
| 4,628,528 | A | 12/1986 | Bose et al. | |
| 5,373,564 | A * | 12/1994 | Spear et al. | 381/352 |
| 5,517,573 | A | 5/1996 | Polk et al. | |
| 5,576,522 | A * | 11/1996 | Taso | 181/199 |
| 5,610,992 | A | 3/1997 | Hickman et al. | |
| 5,714,721 | A | 2/1998 | Gawronski et al. | |
| 5,757,946 | A | 5/1998 | Van Schyndel | |
| 5,953,414 | A | 9/1999 | Abraham et al. | |
| 6,223,853 | B1 | 5/2001 | Huon et al. | |
| 6,275,597 | B1 | 8/2001 | Roozen et al. | |
| 6,278,789 | B1 | 8/2001 | Potter | |
| 2004/0226772 | A1 * | 11/2004 | Hirose et al. | 181/258 |
| 2005/0087392 | A1 * | 4/2005 | Flanders et al. | 181/156 |

FOREIGN PATENT DOCUMENTS

| | | | |
|---|---|---|---|
| EP | 0 909 077 | A2 | 4/1999 |
| EP | 1 244 311 | A1 | 9/2002 |
| EP | 1 372 352 | A2 | 12/2003 |
| GB | 2 302 231 | A | 1/1997 |
| GB | 2 354 393 | A | 3/2001 |

(Continued)

OTHER PUBLICATIONS

Leo L. Beranek, *Acoustics*, Acoustical Society of America 1996 (reprint of 1954 text), Chapter 8, pp. 238-258.

(Continued)

*Primary Examiner*—Edgardo San Martin
*Assistant Examiner*—Forrest Phillips

(57) ABSTRACT

An improvement is provided in loudspeaker enclosures characterised by a frequency response having at least one null due to a cavity mode. The improvement comprises introducing an aperture at a high pressure region of said enclosure for provided a pressure leak thereby substantially eliminating said at least one null.

6 Claims, 4 Drawing Sheets

FOREIGN PATENT DOCUMENTS

| | | |
|---|---|---|
| JP | 2004-285895 | * 10/2004 |
| WO | WO 00/21330 | 4/2000 |
| WO | WO 00/38475 | 6/2000 |
| WO | WO 00/45615 | 8/2000 |
| WO | WO 02/100127 A1 | 12/2002 |

OTHER PUBLICATIONS

Martin Colloms, *High Performance Loudspeakers* $5^{th}$ Ed., John Wiley & Sons, 1999, pp. 136-147.

* cited by examiner

LOUDSPEAKER ENCLOSURE INCORPORATING A LEAK TO COMPENSATE FOR THE EFFECT OF ACOUSTIC MODES ON LOUDSPEAKER FREQUENCY RESPONSE

FIELD OF THE INVENTION

The present invention relates generally to small loudspeaker enclosures and in particular to the use of an aperture for providing a leak to correct the effect of enclosure acoustic modes on the loudspeaker medium frequency response.

BACKGROUND OF THE INVENTION

In small loudspeaker enclosures (e.g. diameter of 50 mm to 64 mm), such as those designed for telephone sets, fairly deep nulls occur at mid to high frequencies due to cavity modes in the enclosure. Because inexpensive components are normally used in the construction of such enclosures, cost constraints generally prohibit modification of the loudspeaker characteristics, such as by damping. In order to obtain high efficiency and the lowest $f_0$ possible, the diaphragm of such small loudspeakers is generally not very well damped. The diaphragm is therefore sensitive to the acoustic resonance of the enclosure cavity, which effectively 'blocks' the diaphragm and results in strong notches in the frequency response curve, often occurring in the frequency band of interest.

It is known in the art to provide optimal porting of the loudspeaker enclosure to modify the loudspeaker frequency response. For example, porting of loudspeaker enclosures has been used extensively for extending bass response (see U.S. Pat. No. 1,869,178 (Thuras)). Leo L. Beranek, in *Acoustics*, Acoustical Society of America 1996 (reprint of 1954 text), provides a very clear description of the basic assumptions and physics in designing a ported loudspeaker enclosure. The primary assumption made is that for low frequencies the wavelength of interest is large compared to the enclosure dimensions, and that the effect of the port is negligible (i.e. the port impedance becomes very large) at higher frequencies. An electrical (or mobility) analogy, known as 'lumped parameter', is derived making the shape of the enclosure and location of the loudspeaker, port, tube, and damping inconsequential.

Since the patent of Thuras, a large number of additional patents have issued describing inventions for correcting many of the problems encountered in specific and in general applications of ported enclosures, as set forth in greater detail below. It will be noted that each of these prior art patents is concerned only with the low frequency performance of the systems and that, because of the assumptions made for the lumped parameter modelling, the actual position of the port is not critical. Colloms suggests that, for small enclosures "it is more common to locate the exit facing away from the listener to reduce the audibility of the unwanted sounds, duct blowing and resonances and acoustic leakage from within the enclosure" (see Martin Colloms, *High Performance Loudspeakers* 5th ed., John Wiley & Sons, 1999).

The use of the lumped parameter method for loudspeaker modelling using electrical components has led to the recognition that the use of multiple ports can be beneficial. U.S. Pat. No. 4,549,631 (Bose) discloses a two port, two cavity loudspeaker while U.S. Pat. No. 5,714,721 (Gawronski) discloses a multi-chamber four port arrangement. U.S. Pat. No. 6,223,853 (Huon) presents the argument that the lumped parameter equivalents of the prior art limit themselves to the fundamental resonant frequency. Huon then presents a more complex model permitting the design of waveguides with at least two sections resulting in more accurate acoustical filters.

As alluded to above, a ported enclosure can exhibit resonant frequencies above those of interest. In U.S. Pat. No. 2,031,500, Olney discloses a folded duct that is lined with acoustically absorptive material so as to permit only low frequency sound to propagate and eventually emanate from the end of the duct. Olney claims that this reduces the "air cavity resonance effect." U.S. Pat. No. 4,628,528 (Bose) uses substantially the same idea but purposely makes the duct as rigid as possible. The various tubes are arranged to provide significant gain (especially in the low frequencies). U.S. Pat. No. 6,278,789 (Potter) attenuates the high frequencies in such a waveguide by the use of a polyester baffle in the cavity placed close to the loudspeaker. U.S. Pat. No. 6,275,597 (Roozen) discloses the use of tuned resonators along the port tube to eliminate unwanted resonances.

As the loudspeaker is reduced in size, the performance of the loudspeaker becomes more demanding and the air velocity through the port becomes larger due to the smaller area. U.S. Pat. No. 5,757,946 (Van Schyndel) discloses the use of a ferro-magnetic fluid to improve the low frequency performance of a small loudspeaker. U.S. Pat. No. 5,517,573 (Polk) discloses a method to reduce the air turbulence noise that results from the use of small area ports.

In commonly-owned US Patent Application No. 2003/0063767, a cap is disclosed to control the effect of acoustic modes that 'block' the loudspeaker diaphragm displacements, thereby decreasing the sound pressure radiation thereby and creating large nulls in the frequency response.

It is an object of an aspect of the present invention to provide an acoustic enclosure with an aperture for providing a leak to correct cavity mode effects. As an added benefit, the aperture can be designed to serve as bass-reflex for low frequency enhancement.

SUMMARY OF THE INVENTION

According to the present invention an aperture is provided in a loudspeaker enclosure for providing a leak of a position such that it permits a pressure release of the cavity acoustic modes that tend to 'block' the loudspeaker cone and cause a drop in external sound pressure level. The strategically positioned aperture substantially eliminates deep nulls in the mid frequency response that occur in a sealed enclosure or one in which a port (e.g. a bass-reflex) cannot be appropriately placed.

BRIEF DESCRIPTION OF THE DRAWINGS

Embodiments of the present invention will now be described more fully with reference to the accompanying drawings in which.

DETAILED DESCRIPTION OF THE PREFERRED EMBODIMENT

Figure 1:
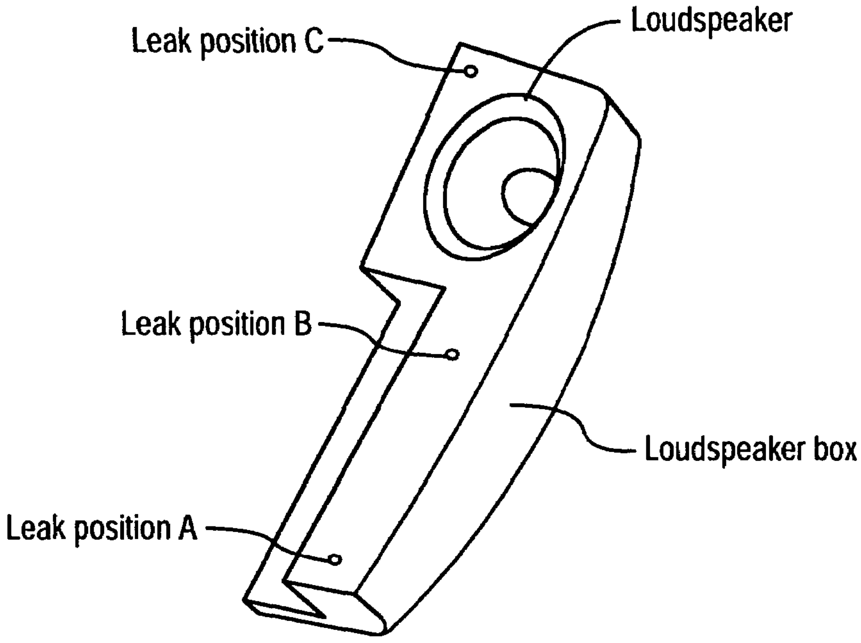
FIG. 1 is a schematic diagram of a loudspeaker enclosure with a plurality of aperture locations in accordance with the present invention.

Acoustic modes refer to standing waves that occur in an acoustic enclosure. They depend on the size and geometry of the cavity as well as the boundary conditions (impedance condition, etc.). Where the enclosure is coupled with an elastic structure, such as a loudspeaker diaphragm (FIG. 1), these acoustic modes can strongly affect the movement of the loudspeaker diaphragm. As set forth in US Patent Application No. 2003/0063767, the loudspeaker diaphragm velocity can be significantly reduced at frequencies close to acoustic resonance of the cavity. This, in turns, results in a significant reduction in the sound pressure radiated by the loudspeaker and gives rise to strong notches in the external sound pressure frequency response curve. This effect depends on the particular acoustic nature and geometry of the enclosure and the characteristics of the loudspeaker diaphragm and its position relative to the acoustic modes' antinodes.

Known solutions to this problem include modifying the geometry, absorbing the acoustic energy inside the cavity or changing the boundary conditions. As discussed above, in many cases geometric modifications are used in combination with sound absorptive material in the cavity.

According to the present invention, an aperture providing a leak is introduced to the enclosure for modifying the boundary conditions. The methodology is as follows:

1. Determine available loudspeakers: the choice is dictated by finding a compromise of cost, quality and size.

2. Determine the available loudspeaker enclosure volume and geometry (this is often dictated by the product exterior design).

3. Develop a numerical model of the loudspeaker and its enclosure. Calculate the modes in the cavity and the fully coupled loudspeaker cone/cavity system acoustical behavior. This can be accomplished either analytically for simple shapes by assuming a clamped circular plate as an approximation for the loudspeaker diaphragm, or numerically using Finite Element/Boundary Element methods for complex shapes.

4. Design an appropriate aperture or port for providing a leak to alleviate the anti resonance notch without sacrificing low frequency efficiency. Opening the cavity shifts up the $f_0$ as compared to a completely closed enclosure.

5. From the calculation of the resonance inside the cavity for the full coupled problem (cavity coupled acoustic resonance, in Step 2) determine which modes must be treated by the leak. Place the aperture (designed in Step 3) at the appropriate position in the cavity. This is usually close to a high-pressure area in the enclosure and in phase with the external pressure field to avoid an acoustical short circuit. For this reason, an aperture position close to the speaker is inappropriate for the present application.

6. Tune the aperture. As the aperture is opened in the enclosure, the resonant behavior of the system changes, so that the aperture dimensions must be optimized. The cavity resonance frequency shifts up, as does the anti-resonance, and the frequency response notch must be filled with the acoustic resonance of the aperture coupled to the cavity. This can be achieved experimentally on a prototype or by using predictive methods such as numerical methods (Boundary/Finite Element methods).

The design method set forth above ensures that in a small enclosure, any mid to high frequency cavity mode problems are minimized. The internal pressure field that is in phase with the external pressure field is then 'driven' out of the enclosure, and a peak rather than a notch appears at the coupled acoustic mode frequency. In order to minimize this peak amplitude in the external sound pressure level frequency response curve, an aperture exhibiting a slow leak may be used, by adding an acoustic resistance (e.g. a layer of cloth, Pelon™ for example, or a screen built directly within the enclosure plastics). It should be noted that because no absorptive material or additional damping is imposed on the loudspeaker, the efficiency of the loudspeaker is not reduced.

FIG. 1 shows an exemplary loudspeaker design with an enclosure wherein the geometry is dictated by the industrial design of the telephone in which this enclosure is designed to fit. According to the telephony application for which the loudspeaker of FIG. 1 is designed the loudspeaker response must be reasonably flat from 200 Hz to about 6400 Hz to accommodate the requirements of ITU P.341.

Figure 2:
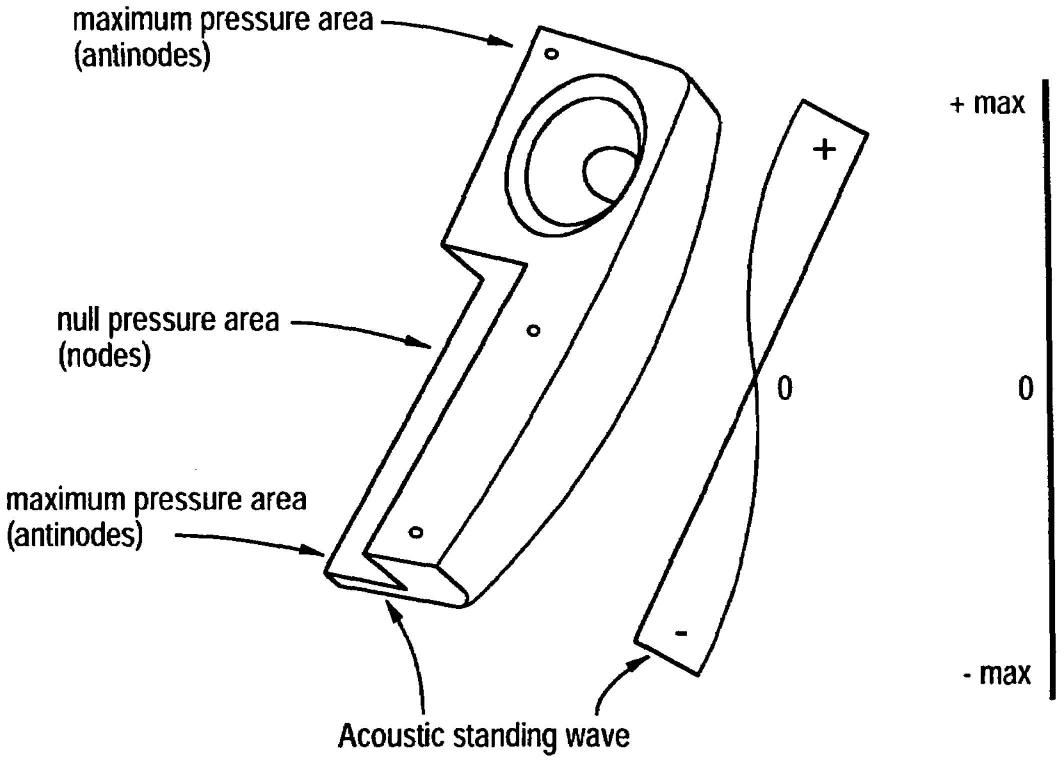
FIG. 2 is a diagram illustrating acoustic mode behavior in the closed cavity of the speaker enclosure of FIG. 1.

To understand the modal behavior of the loudspeaker in FIG. 1, the acoustic modes are calculated using a Finite Element Method (FEM). A rendition of the mode behaviour is presented in FIG. 2. Specifically, the mode number 2 is depicted having its coupled resonant frequency close to 1200 Hz (mode number 1 refers to a constant pressure state in the cavity). From a review of FIG. 2, it is evident that the correct positioning of the aperture within this cavity will release the pressure and attenuate the effect of the mode on the diaphragm.

Figure 3:
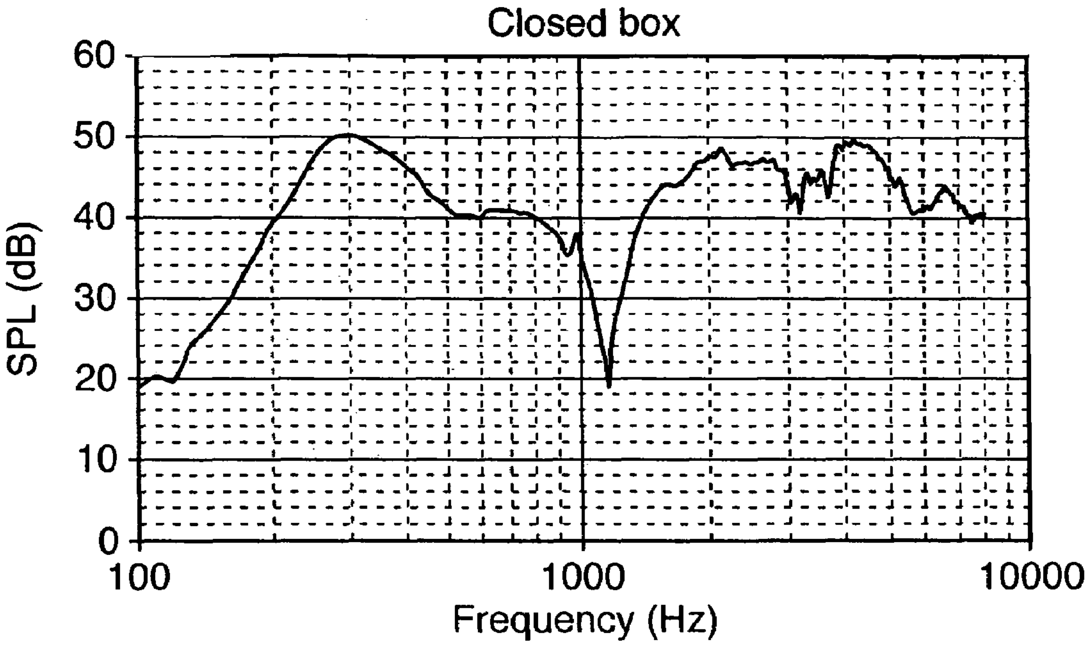
FIG. 3 is the frequency response of the sealed enclosure of FIG. 1 inserted in a telephone set, with no aperture.

To illustrate the benefit of the invention, consider the frequency response (FIG. 3) of the enclosure shown in FIG. 1 with no port, which indicates a significant null centered at about 1200 Hz.

Figure 4:
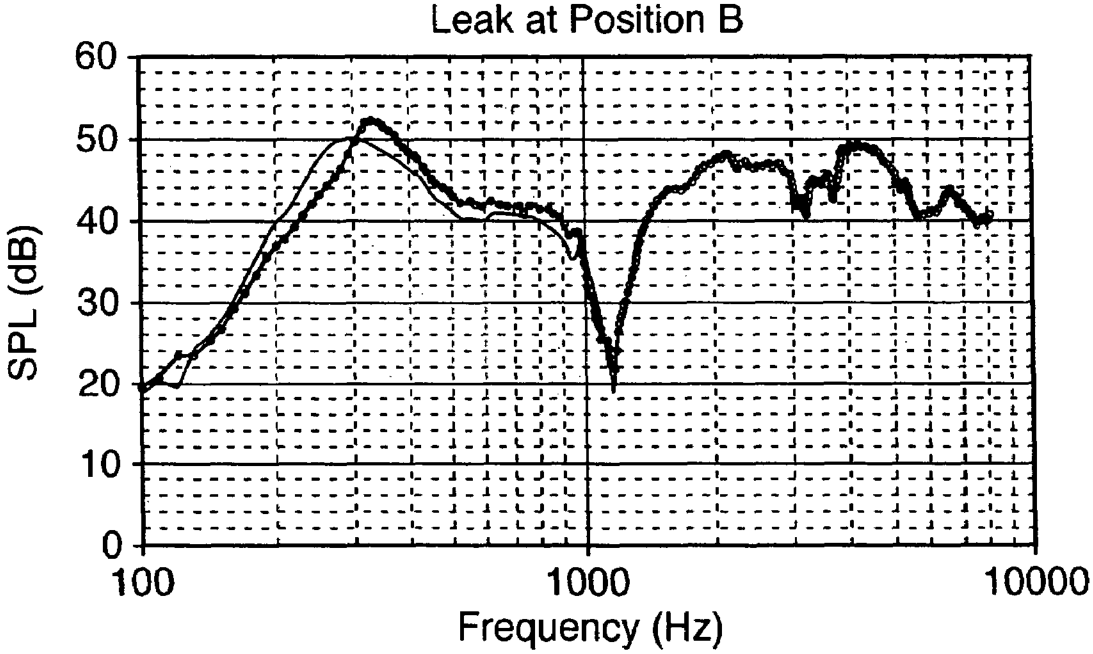
FIG. 4 is the frequency response of the enclosure of FIG. 1 inserted in a telephone set, with the aperture located at position B.
Figure 5:
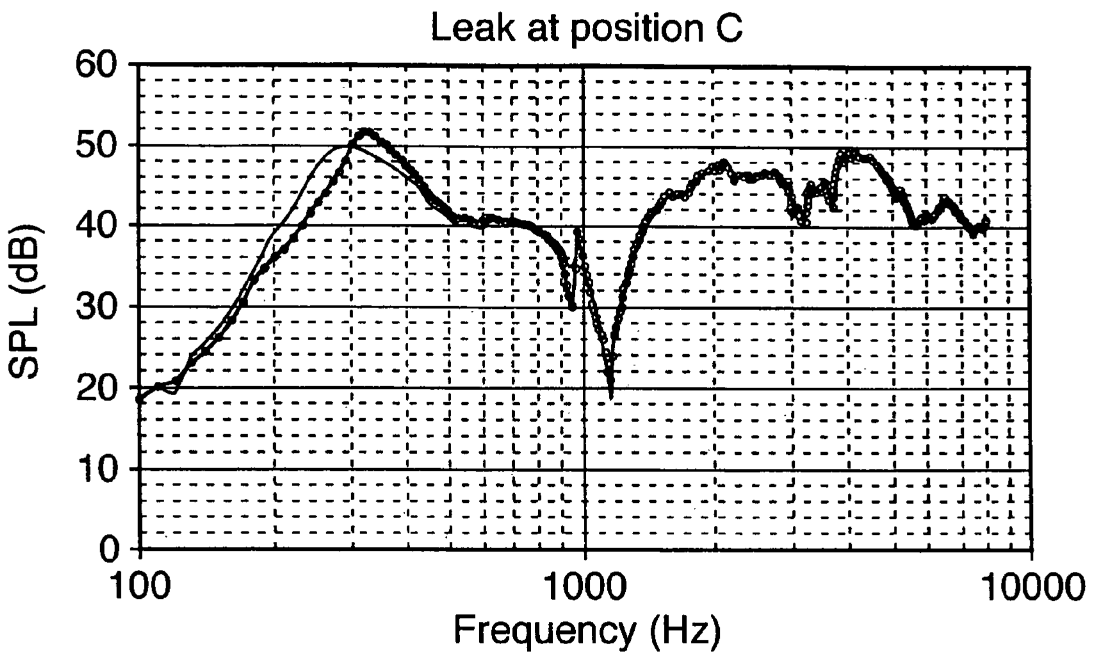
FIG. 5 is the frequency response of the enclosure of FIG. 1 inserted in a telephone set, with the aperture located at position C.

In FIGS. 4 and 5 the effect of an aperture for providing a leak placed at incorrect positions B and C, respectively, is evident. The low frequency resonance is shifted up by about 50 Hz. However, the deep null at 1200 Hz remains as deep and also shifts up as it follows the resonant frequency of an open box.

Figure 6:
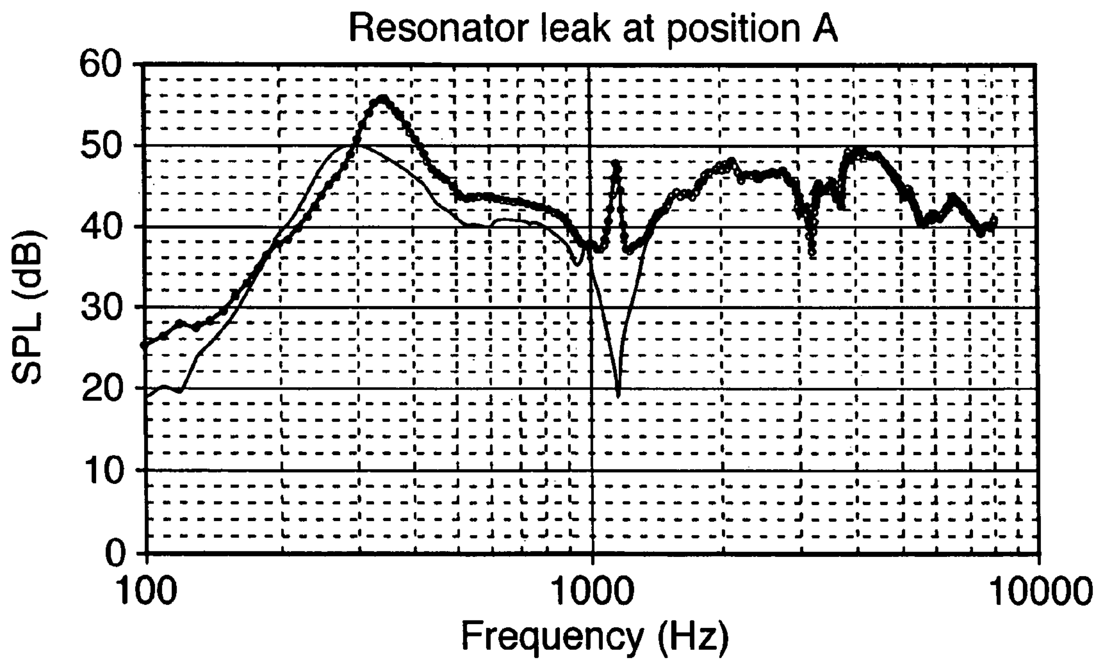
FIG. 6 is a frequency response of the enclosure of FIG. 1 inserted in a telephone set, with a resonant (i.e. open tube) aperture at location A.

FIG. 6 illustrates the beneficial results of using an aperture located at location A for providing a leak. The low frequency is again shifted up by about 50 Hz due to the leak however a slight peak is evident in the frequency response at 1200 Hz instead of a deep null. In the particular case of FIG. 6, a 6 mm diameter 3 mm long tubular aperture was used. The exact dimensions are dependent on the total system dimensions and must be tuned as noted above in step 5.

Figure 7:
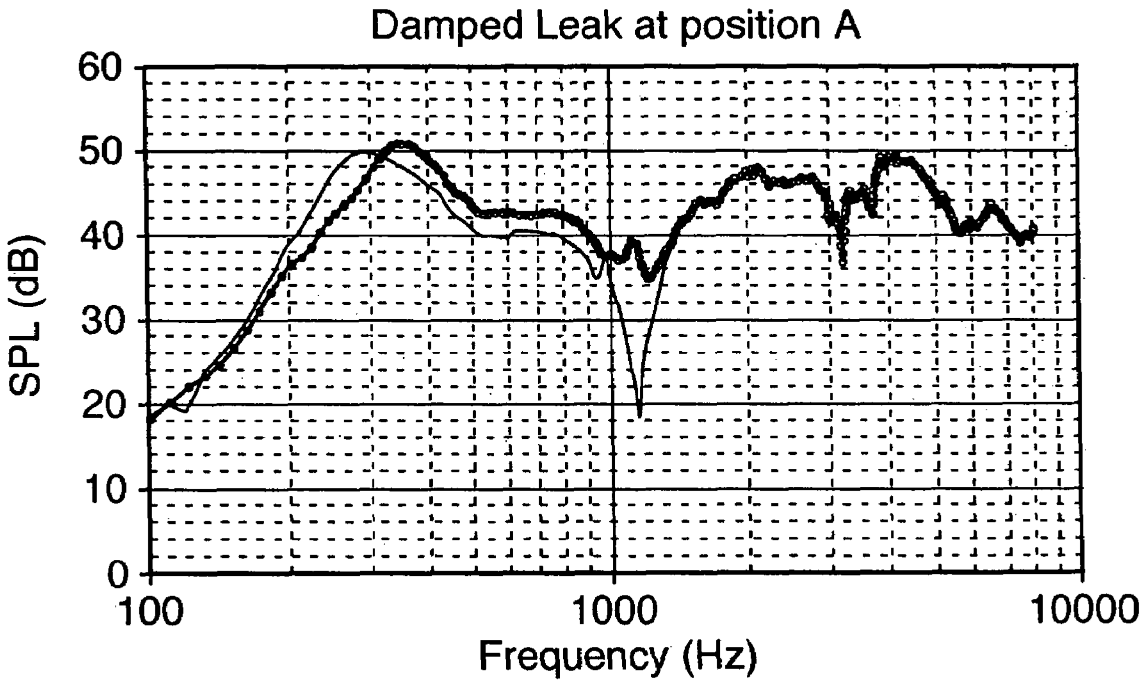
FIG. 7 shows the frequency response of the enclosure of FIG. 1 inserted in a telephone set, with a "damped" aperture at position A.

FIG. 7 illustrates the frequency response obtained when the aperture at location A is damped by the addition of acoustic impedance created through the use of acoustically resistive material. As before, the resonant frequency is shifted up by about 50 Hz. However, its magnitude is damped and the null is virtually filled in resulting in a substantially smoother frequency response.

Other embodiments and variations are contemplated. For example, in one alternative embodiment, the acoustic impedance is created using small perforations in a thin plate that are an integral part of the aperture. This can be accomplished in a manner similar to the method disclosed in GB 2,354,393 (Turner et al). Also, as discussed above, the aperture can be designed to be a bass-reflex, depending on the characteristics of the loudspeaker diaphragm and the size of the cavity (see, for example, Beranek, supra). However, it is important to ensure that the aperture of the bass-reflex port drives out sufficient internal energy and places the resonant peak at the frequency of the null. Since opening the cavity changes its boundary conditions and the frequency of the coupled acoustic resonance in some circumstances the design of the bass reflex will not always be possible.

All such embodiments and variations are believed to be within the sphere and scope of the invention as defined in the claims appended hereto.

What is claimed is:

1. In a loudspeaker enclosure operating in an external pressure field and characterized by a frequency response having at least one null due to a cavity mode in the enclosure, the improvement comprising an aperture in a vicinity of a high pressure region of said enclosure for providing a pressure leak, the aperture communicating an internal pressure field of the enclosure with the external pressure field, the aperture being in phase with the external pressure field for providing a pressure leak to substantially eliminate said at least one null.

2. The improvement of claim 1, further including damping material in said aperture for smoothing said frequency response.

3. The improvement of claim 2, wherein said damping material comprises a perforated sheet in said aperture.

4. A loudspeaker for operation in an external pressure field, comprising:

an enclosure of predetermined volume and geometry giving rise to at least one null due to a cavity mode there in;

a loudspeaker optimized for use in said enclosure; and an aperture positioned adjacent a high pressure region of said enclosure for providing a pressure leak, the aperture communicating an internal pressure field of the enclosure with the external pressure field, the aperture being in phase with the external pressure field, for providing a pressure leak to substantially eliminate said at least one null.

5. The loudspeaker of claim 4, further including damping material in said aperture for smoothing said frequency response.

6. The loudspeaker of claim 5, wherein said damping material comprises a perforated sheet in said aperture.

* * * * *